United States Patent [19]

Nishihara et al.

[11] Patent Number: 4,785,141
[45] Date of Patent: Nov. 15, 1988

[54] WIRING STRUCTURE OF TERMINATION CIRCUIT

[75] Inventors: Mikio Nishihara, Setagaya; Kiyoshi Kuwabara, Yokohama, both of Japan

[73] Assignee: Fujitsu Limited, Kawasaki, Japan

[21] Appl. No.: 124,418

[22] Filed: Nov. 18, 1987

Related U.S. Application Data

[63] Continuation of Ser. No. 893,318, Jul. 29, 1986, abandoned.

[30] Foreign Application Priority Data

Nov. 29, 1984 [JP] Japan .............................. 59-253562

[51] Int. Cl.$^4$ ............................................. H05K 1/11
[52] U.S. Cl. ................... 174/68.5; 361/406; 361/409; 361/414
[58] Field of Search ............... 361/414, 406, 409; 174/68.5

[56] References Cited

U.S. PATENT DOCUMENTS

| | | | |
|---|---|---|---|
| 3,898,370 | 8/1975 | Davy et al. | 361/414 X |
| 4,150,421 | 4/1979 | Nishihara et al. | 174/68.5 X |
| 4,371,744 | 2/1983 | Badet et al. | 361/414 X |
| 4,546,413 | 10/1985 | Feinberg et al. | 361/414 X |
| 4,562,513 | 12/1985 | Arnold et al. | 174/68.5 X |
| 4,613,924 | 9/1986 | Brault | 174/68.5 X |
| 4,620,264 | 10/1986 | Ushifusa et al. | 174/68.5 X |

OTHER PUBLICATIONS

IEEE Transactions on Components, Hybrids and Manufacturing Technology, vol. CHMT-3, No. 4, Dec. 1980, "A Multilayer Ceramic Multichip Module", by A. J. Blodgett, Jr., pp. 634–637.

IBM Technical Disclosure Bulletin, vol. 22, No. 5, Oct. 1979, "Multilayer Ceramic Fixed Layer Substrate Design", Johnson et al., pp. 1841–1842.

Elektronik, vol. 29, No. 21, Oct. 1980, "Bessere Leiterplattenausnutzung mit neuem Mehrchip-IC-Gehause", H. Krumm, pp. 125–128.

Primary Examiner—R. R. Kucia
Attorney, Agent, or Firm—Staas & Halsey

[57] ABSTRACT

A wiring structure for a termination circuit in which a termination circuit is connected to an integrated circuit through a fixed wiring pattern provided in a leadout layer closest to the mounting surface.

1 Claim, 2 Drawing Sheets

WIRING STRUCTURE OF TERMINATION CIRCUIT

This application is a continuation of U.S. application Ser. No. 893,318, filed July 29, 1986, now abandoned.

CROSS-REFERENCE TO THE RELATED APPLICATION

This application is cross-referenced to copending U.S. application Ser. No. 893,321, filed July 29, 1986.

BACKGROUND OF THE INVENTION

The present invention relates to an improved wiring structure between large scale integrated (LSI) circuits and the termination circuits mounted on a multilayered printed circuit board. More particularly, the present invention is directed to a wiring structure of a termination circuit which is used for improving quality and performance of a printed circuit board by reducing the number of wirings for the signal layers in the printed circuit board.

There is a printed circuit board which mounts many LSI circuits and is widely used. Since each LSI circuit mounts a corresponding termination circuit, the circuit wiring in the printed circuit board is complicated. Particularly, in a case where a circuit wiring pattern connects the through hole for connecting a general circuit and the through hole for connecting a termination circuit exists in the signal layers of the printed circuit board, the following problems exist. A conductor impedance between the termination circuit and an LSI circuit becomes high and interference between circuits in the signal layers increases. Moreover, in the structure described above, since the number of required circuit wirings to the termination circuit inevitably increases with an increase in the amount of wiring of each LSI circuit, the wirings of the signal layers in the printed circuit board become more complicated.

SUMMARY OF THE INVENTION

It is an object of the present invention to solve the problems described above, that is, to suppress an increase in the amount of circuit wirings of the signal layers in the multilayered printed circuit board.

The present inveniton provides a structure for a multilayered printed circuit board having LSI circuits connected electrically by way of through holes and a termination circuit, such that the circuit wirings electrically connecting the termination circuit, the LSI circuits, and the through holes are replaced with a fixed pattern provided on the leadout layer nearest the surface of the multilayered printed circuit board.

The most distinctive characteristic of the present invention is that congestion in the signal layers where the circuit wirings of an LSI circuit are concentrated is alleviated by shifting the wiring position of the termination circuit wiring pattern from the signal layers in the printed circuit board to the leadout layer nearest to the surface of the printed circuit board.

BRIEF DESCRIPTION OF THE DRAWINGS

FIG. 1 is an embodiment of a termination circuit wiring structure according to the present invention; wherein FIG. 2 is a termination circuit wiring structure according to the prior art; wherein

DESCRIPTION OF THE PREFERRED EMBODIMENT

First, a wiring structure of a termination circuit is explained with reference to FIG. 2.

Figure 2A:
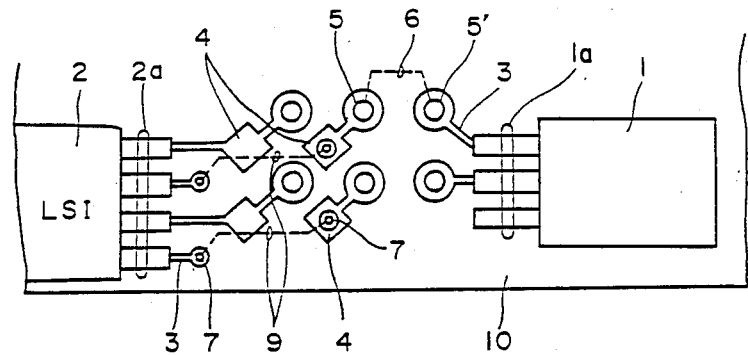
FIG. 2A is a plan view.
Figure 2B:
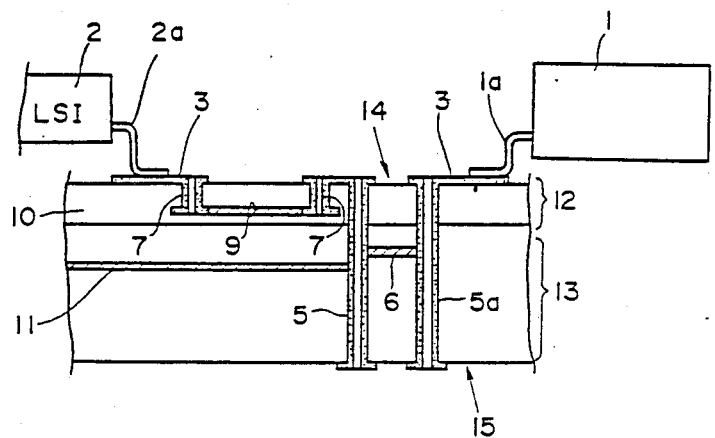
FIG. 2B is a side sectional view.

FIG. 2A and FIG. 2B respectively show a typical termination circuit wiring structure of the prior art. In this case, a circuit wiring pattern 6 is provided in the signal layer 13 of the internal layers of a printed circuit board in order to connect a through hole 5 connecting a general circuit and a through hole 5a for connecting a termination circuit. As shown in FIG. 2B, a general circuit wiring pattern 11 between LSI circuits is provided in the signal layer 13.

Many conductors such as a lead pattern 3, a blind through hole 7, a leadout pattern 9, a bonding pad 4, a through hole 5 for connecting a general circuit, a circuit wiring pattern 6 and a through hole 5a for connecting a termination circuit are used for connecting a signal terminal 2a for connecting an LSI circuit 2 and a signal terminal 1a for connecting a termination circuit 1 mounted on the multilayered printed circuit board 10.

Therefore, when the circuit wiring pattern 6 for connecting the through hole 5 and the through hole 5a exists as shown in FIG. 2B in the signal layer 13 of the printed circuit board, the following problems arise. A conductor impedance between the termination circuit and the LSI circuit 2 becomes high and interference between circuits in the signal layer 13 increases.

According to the wiring structure of the termination circuit of the present invention, such problems can be eliminated.

The preferred embodiment of the present invention is shown in FIG. 1 and is explained in detail. Like components are given the same reference numerals throughout.

Figure 1A:
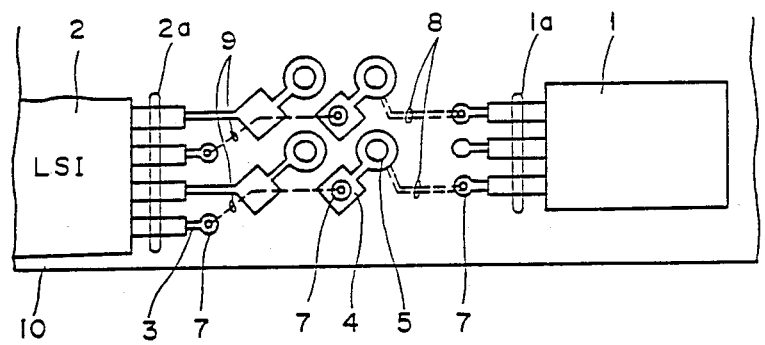
FIG. 1A is a plan view.
Figure 1B:
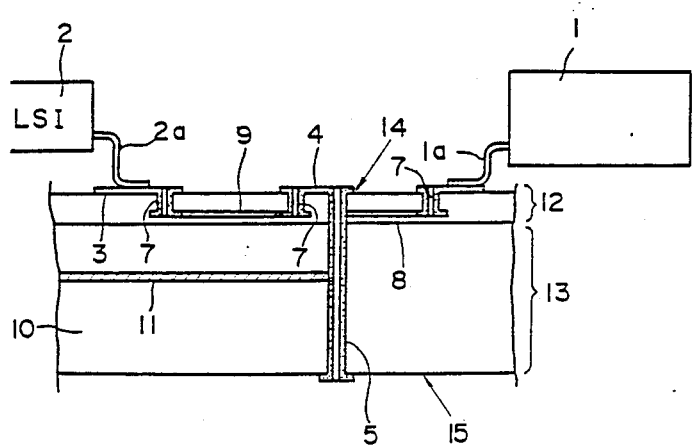
FIG. 1B is a side sectional view.

As shown in FIG. 1A and FIG. 1B, the termination circuit wiring structure of the present invention includes a fixed pattern 8 which electrically connects the termination circuit 1 and the through hole 5 through a blind through hole 7. The blind through hole 7 is provided within the leadout layer 12 nearest the mounting surface 14 of the multilayered printed circuit board 10.

The termination circuit wiring structure of the present invention shown in FIG. 1B is characterized in that a circuit wiring pattern 6 described in prior art FIG. 2 is not provided but instead, a fixed pattern 8 is employed which is part of the leadout layer 12 not the signal layer 13. Thus, at the signal layer 13, wiring to the termination circuit 1 is eliminated and the termination circuit 1 is wired more effectively to the signal layer 13 than the prior art.

The blind through hole 7 described above is not bored through both front and rear surfaces of the printed circuit board 10, as are the through holes 5, and is a so-called "short-leg type" special through hole for electrically connecting the lead pattern 3, bonding pad 4 and leadout pattern 9 and connecting between the terminal 1a and the fixed pattern 8. Therefore, the blind through hole 7 provides the advantages that it can avoid interference with the other through hole 5 bored through the front and rear surfaces, and in addition, the extra area of the signal layer 13 can be used effectively.

As described above, the termination circuit wiring structure of the present invention provides the advantages that the signal wiring density of the printed circuit board can be improved remarkably by shifting the termination circuit wiring pattern (which is provided at the signal layer) to the leadout layer nearest the surface of the multilayered printed circuit board 10.

The wiring structure of the termination circuit disclosed in the present invention can be used for multilayered printed circuits of any type and is particularly effective for a printed circuit board having a high density wiring pattern for mounting LSI circuits.

What is claimed is:

1. A wiring structure for a termination circuit in a mutli-layered printed circuit board for mounting integrated circuits having signal terminals and termination circuits electrically connected by circuit wiring patterns formed on internal layers by way of throughholes, said wiring structure comprising:

a signal layer;

circuit wiring patterns formed in said signal layer;

a leadout layer formed on said signal layer;

leadout patterns formed in a portion of said leadout layer;

first throughholes extending through said leadout layer and said signal layer;

first lead patterns formed on said leadout layer and connected to the signal terminals of said integrated circuits;

first blind throughholes formed in said leadout layer and connecting said leadout patterns and said first lead patterns;

second lead patterns formed on said leadout layer and connected to said first throughholes;

second blind throughholes formed in said leadout layer and connecting said leadout patterns and said second lead patterns;

third lead patterns formed on said leadout layer and connected to terminals of said termination circuit;

third blind throughholes formed in said leadout layer and connected to said third lead patterns; and fixed circuit patterns formed in said leadout layer and connecting said first throughholes and said third blind throughholes.

* * * * *